US012609522B2

(12) United States Patent
Terada et al.

(10) Patent No.: US 12,609,522 B2
(45) Date of Patent: Apr. 21, 2026

(54) SEMICONDUCTOR INTEGRATED CIRCUIT DEVICE

(71) Applicants: Chuhei Terada, Isehara (JP); Yoichi Takano, Hadano (JP)

(72) Inventors: Chuhei Terada, Isehara (JP); Yoichi Takano, Hadano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 186 days.

(21) Appl. No.: 18/426,427

(22) Filed: Jan. 30, 2024

(65) Prior Publication Data

US 2024/0258786 A1 Aug. 1, 2024

(30) Foreign Application Priority Data

Jan. 31, 2023 (JP) ................................. 2023-012764

(51) Int. Cl.
H02H 3/08 (2006.01)
H02H 1/00 (2006.01)
H03K 5/24 (2006.01)
(52) U.S. Cl.
CPC ............ *H02H 3/08* (2013.01); *H02H 1/0007* (2013.01); *H03K 5/24* (2013.01)
(58) Field of Classification Search
CPC ........ H02H 3/08; H02H 1/0007; H02H 7/008; H03K 5/24; H03K 17/0822; H03K 17/6871; H03K 2017/0806
See application file for complete search history.

(56) References Cited

U.S. PATENT DOCUMENTS

| | | | | |
|---|---|---|---|---|
| 9,160,165 | B2 * | 10/2015 | Cortigiani | ................ H02H 9/02 |
| 10,243,344 | B2 * | 3/2019 | Nate | ...................... H02M 3/155 |
| 10,790,657 | B2 * | 9/2020 | Takuma | .................. B60R 16/03 |
| 12,294,355 | B2 * | 5/2025 | Takano | .............. H03K 17/0822 |

FOREIGN PATENT DOCUMENTS

JP        2022-89211 A      6/2022

* cited by examiner

*Primary Examiner* — Crystal L Hammond
*Assistant Examiner* — Samantha L Faubert
(74) *Attorney, Agent, or Firm* — Shih IP Law Group, PLLC

(57) ABSTRACT

A semiconductor integrated circuit device includes the following. An output transistor is connected between a voltage input terminal and a voltage output terminal. A control circuit controls an on state or an off state of the output transistor. An overcurrent detection circuit is capable of detecting a current that is a predetermined value or more flowing in the output transistor. A retry circuit generates and outputs a signal to intermittently switch the output transistor to the off state according to the overcurrent detection circuit detecting an overcurrent state. An external terminal outputs an error flag signal showing an abnormality. The control circuit repeats control to temporarily turn off the output transistor. After the overcurrent detection circuit detects the overcurrent state, the retry circuit is configured so that the error flag signal continuously shows an abnormality while the control circuit repeats control to temporarily turn off the output transistor.

6 Claims, 6 Drawing Sheets

SEMICONDUCTOR INTEGRATED CIRCUIT DEVICE

REFERENCE TO RELATED APPLICATIONS

This application is based upon and claims the benefit of priority from the prior Japanese Patent Application No. 2023-012764, filed on Jan. 31, 2023, the entire contents of which are incorporated herein by reference.

TECHNICAL FIELD

The present invention relates to a semiconductor integrated circuit device (IC) including a switch or output transistor connected between a voltage input terminal and output terminal, and an overcurrent protection circuit that protects the transistor from the overcurrent. The present invention relates to a technique that is effective for use in a high-side switch IC and a linear regulator IC (power supply IC), for example.

DESCRIPTION OF RELATED ART

There is a high-side switch IC which is connected between a power supply and a load and which includes a function of supplying or cutting off power supply voltage to a load. There is also a power supply IC which constitutes a linear regulator as an IC which controls the transistor provided between a DC voltage input terminal and an output terminal to output a DC voltage with a desired potential.

The high-side switch IC and the power supply IC may be provided with an overcurrent protection circuit which protects the transistor from an overcurrent.

In an operation of a conventional typical overheat protection function, when a temperature of a junction (chip joint surface) reaches 150° C., the current is cut off, and when the temperature becomes 100° C., the operation is restored. In such case, the temperature of the junction is 100 to 150° C. Therefore, there is no problem if a momentary short circuit occurs. However, if a continuous short circuit occurs in the load, the temperature will remain 100° C. or higher. As a result, there is a problem that the life of the device may be shortened or the element may be destroyed.

In view of the above, the inventors of the present invention invented and filed a patent regarding a technique used in a semiconductor integrated circuit such as a high-side switch IC or a power supply IC including a transistor connected between a voltage input terminal and an output terminal and a overcurrent protection circuit in order to be able to cut output current before exceeding allowable loss without using an overheat protection function (Japanese Unexamined Patent Publication No. 2022-89211).

The invention described in Japanese Unexamined Patent Publication No. 2022-89211 is as follows. A semiconductor integrated circuit device includes the following. An output transistor is connected between a voltage input terminal in which DC voltage is input and a voltage output terminal. A control circuit controls the output transistor to be an on state or an off state. A proportional current generating circuit is able to generate a current proportionally reduced from the current flowing in the output transistor. An overcurrent detection circuit is able to detect whether a current equal to or larger than a predetermined value flows in the output transistor based on the current generated by the proportional current generating circuit. A retry circuit generates and outputs a signal to turn off the output transistor intermittently according to the overcurrent detection circuit detecting the overcurrent state of the output current. The control circuit repeats control to temporarily turn off the output transistor based on the signal output from the retry circuit.

However, according to the invention described in Japanese Unexamined Patent Publication No. 2022-89211, there is a problem that it is not possible to know from outside that an overcurrent state of the output current is occurring and the retry operation is being performed. Therefore, the inventors conceived a circuit as shown in FIG. 5. An error flag terminal is provided in the semiconductor integrated circuit of Japanese Unexamined Patent Publication No. 2022-89211, and a signal showing the state of the circuit is output from the error flag terminal by the output of the comparator performing the determination of retrying.

However, in the circuit shown in FIG. 5, as shown in FIG. 6, the error flag Err_Flag repeats a state showing normal (high) and a state showing abnormal (low) by following a high/low output of the comparator performing the determination of the retrying. Therefore, in the external device that receives the error flag, it is difficult to determine the abnormal state of the circuit, and there is a problem that it becomes difficult to use.

SUMMARY OF THE INVENTION

The present invention is conceived in view of the above problems, and the purpose of the present invention is as follows. That is, a semiconductor integrated circuit device includes an output transistor connected between a voltage input terminal and an output terminal, and an overcurrent protection circuit. The semiconductor integrated circuit device includes a retry function which repeats an operation to cut the output current before exceeding an allowable loss without using the overheat protection function and to automatically resume to a steady state once the overcurrent state is resolved. The semiconductor integrated circuit device continues to output a signal showing an abnormal state while the retry operation is repeated.

In order to achieve the above object, according to one aspect, a semiconductor integrated circuit device includes, an output transistor that is connected between a voltage input terminal to which a DC voltage is input and a voltage output terminal; a control circuit that controls an on state or an off state of the output transistor; an overcurrent detection circuit that is capable of detecting a current that is a predetermined value or more flowing in the output transistor; a retry circuit that generates and outputs a signal to intermittently switch the output transistor to the off state according to the overcurrent detection circuit detecting an overcurrent state of an output current; and an external terminal that is configured to output an error flag signal showing an abnormality of an internal circuit, wherein, the control circuit is configured to repeat control to temporarily turn off the output transistor based on a signal output from the retry circuit, and after the overcurrent detection circuit detects the overcurrent state of the output current, the retry circuit is configured so that the error flag signal continuously shows an abnormality while the control circuit repeats control to temporarily turn off the output transistor.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein:

FIG. 3 is a circuit diagram showing a specific example of a proportional current generating circuit that constitutes an overcurrent detection circuit of the high-side switch IC according to the present embodiment;

DETAILED DESCRIPTION

Hereinafter, one or more embodiments of the present invention will be described with reference to the drawings. However, the scope of the present invention is not limited to the disclosed embodiments.

Hereinafter, suitable embodiments of the present invention are described with reference to the drawings.

First Example

Figure 1:
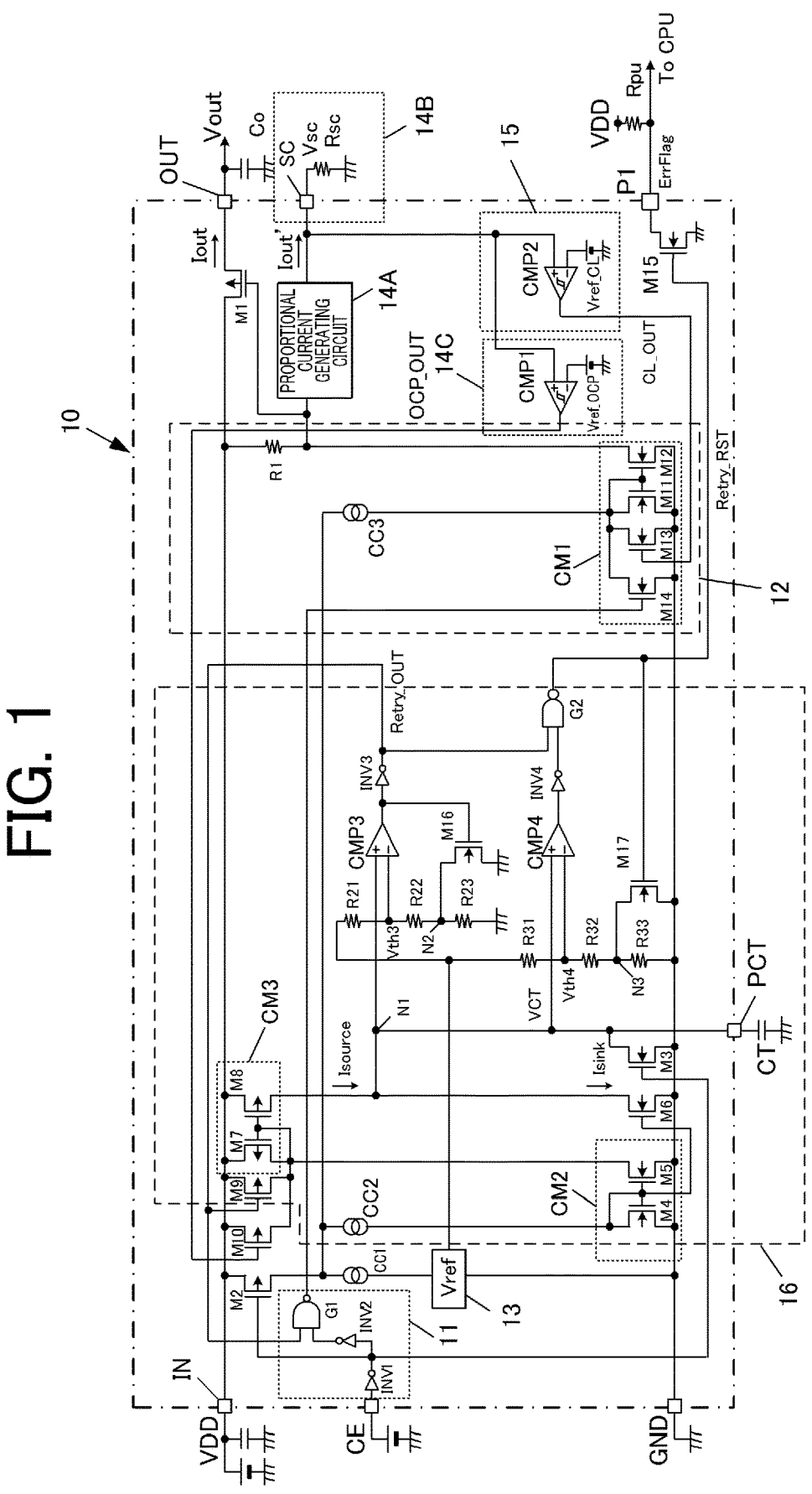
FIG. 1 is a circuit configuration diagram showing an embodiment of a high-side switch IC in which the present invention is applied.

FIG. 1 shows an embodiment of a high-side switch IC in which the present invention is applied. In FIG. 1, the portion surrounded by a dashed dotted line forms a semiconductor integrated circuit (IC) 10 on a semiconductor chip such as a single crystal silicon. An output stabilizing capacitor Co is connected to an output terminal OUT of the IC 10.

In the high-side switch IC 10 according to the present embodiment, as shown in FIG. 1, a switch transistor M1 including a P channel MOS transistor is connected between a voltage input terminal IN in which a DC voltage VDD is applied and an output terminal OUT. The IC 10 is provided with a chip control terminal CE in which a signal from an external microcomputer (CPU) or the like is input, a logic circuit 11 in which a potential of the terminal CE is input, and a control circuit 12 that generates a gate control signal of the transistor M1 by an output from the logic circuit 11. The control circuit 12 generates the gate control signal that switches the transistor M1 to an on state or an off state according to the potential of the terminal CE.

The control circuit 12 includes a current mirror circuit CM1, a P channel MOS transistor M2, a constant current source CC3, and a current-voltage conversion resistor R1. The current mirror circuit CM1 includes N channel MOS transistors M11 to M14. The current mirror circuit CM1 includes an on/off function that turns on and off according to an output signal from the logic circuit 11. The P channel MOS transistor M2 and the constant current CC3 are connected in series with the primary side transistor M11 of the current mirror circuit CM1. The current-voltage conversion resistor R1 is connected in series with the secondary side transistor M12 of the current mirror circuit CM1. The transistors M13 and M14 are on/off transistors. The logic circuit 11 includes an inverter INV1, an inverter INV2, and an NAND gate G1. The inverter INV1 inverts a logic potential of the chip control terminal CE. The inverter INV2 further inverts the output of the inverter INV1. The output of the INV1 and a signal from a later-described retry circuit 16 are input in the NAND gate G1.

In the control circuit 12, when the transistor M14 is turned on by the output of the logic circuit 11, the current I3 of the constant current source CC3 flows in the M14. With this, M11 and M12 are turned off and the current does not flow in the resistor R1. Then, the DC voltage VDD is applied to the gate terminal of the transistor M1 through the resistor R1 and M1 is set to the off state. On the other hand, when the transistor M14 is turned off by the output of the logic circuit 11, the current I3 of the constant current source CC3 flows in the M11 and then the current flows in the M12 and the resistor R1. With this, the voltage dropped in the resistor R1 is applied in the gate terminal of the transistor M1 and M1 is set to the on state.

The high-side switch IC10 according to the present embodiment is provided with a standard voltage circuit 13 to generate the standard voltage Vref and a constant current source CC1 that is connected in series with the transistor M2 and that flows an operation current in the standard voltage circuit 13. The standard voltage circuit 13 may include a bandgap, a series resistor, and a Zener diode.

Further, the high-side switch IC10 of the present embodiment is provided with an overcurrent protection circuit 14, a comparator (voltage comparison circuit) CMP2 including a current limit circuit 15 that limits the output current Iout, the retry circuit 16, and a switch transistor M10 that controls on and off of the current circuit of the retry circuit 16 with the output of the overcurrent protection circuit 14.

The overcurrent protection circuit 14 includes a proportional current generating circuit 14A, a current-voltage conversion circuit 14B, and an overcurrent detection circuit 14C. The proportional current generating circuit 14A generates a current Iout' proportional to an output current Iout that flows to the output terminal OUT by the transistor M1. The current-voltage conversion circuit 14B converts the generated current Iout' to a voltage. The overcurrent detection circuit 14C detects an overcurrent state based on the converted voltage. The output OCP_OUT of the overcurrent detection circuit 14C is input to the gate terminal of the switch transistor M10.

The IC10 is provided with an external terminal SC to flow the current Iout' generated by the proportional current generating circuit 14A. The current-voltage conversion circuit 14B includes an external resistance element Rsc connected between the external SC and a ground point. The overcurrent detection circuit 14C includes a comparator CMP1 that compares a voltage Vsc converted by a resistance element Rsc and a reference voltage Vref_OCP set in advance. The comparator used for the comparators CMP1 and CMP2 include hysteresis characteristics. The resistor Rsc may be an on-chip element.

A voltage converted by the resistance element Rsc and the reference voltage Vref_CL set in advance are input in the comparator CMP2 included in the current limit circuit 15. When the current Iout', that is, the output current Iout exceeds a predetermined current value, the output CL_OUT of the comparator CMP2 changes to high level. The output CL_OUT of the comparator CMP2 is input in the gate terminal of the transistor M13 connected parallel with the primary side transistor M11 of the current mirror circuit CM1 of the control circuit 12. When the output CL_OUT of the comparator CMP2 changes to the high level, M13 is turned on. Then, the current of M11, M12, and resistor R1 is reduced. With this, the gate-source voltage of the output transistor M1 is made small, and the current is limited so that the output current Iout that is equal to or larger than the predetermined value does not flow. That is, the current circuit 15 includes the comparator CMP2 and the transistor M13.

The reference voltage Vref_CL of the current limit circuit 15 is set to a value larger than the reference voltage Vref_OCP of the overcurrent detection circuit 14C. The above setting is so that the current limit circuit functions when the output current larger than the current in which the overcurrent protection function operates flows. In this case, for example, the element size (gate width) of the transistor M13 is made smaller than the size of M11 and M12. Then, when M13 is turned on and the current IM13 flows in M13, the current which is the difference from the current I3 of the constant current source CC3 also flows in M11 and M12 (I3-IM13). With this, the gate voltage of the output transistor M1 becomes lower than VDD, and the clamped current flows in M1. Alternatively, the value of the resistor R1 may be adjusted.

The retry circuit 16 includes a constant current source CC2, a current mirror circuit CM2, a current mirror circuit CM3, transistors M6 and M3, a comparator CMP3, and an inverter INV3. The constant current source CC2 is connected in series with the transistor M2. The current mirror circuit CM2 includes the N channel MOS transistors M4 and M5. The current of the constant current source CC2 flows in the primary side of the current mirror circuit CM2. The current mirror circuit CM3 includes the P channel MOS transistors M7, M8 and folds the current of the secondary side of the current mirror circuit CM2. The transistor M6 is connected in series with the transistor M8 of the current mirror circuit CM3 and the transistor M3 is connected in parallel with M6. The comparator CMP3 compares the drain voltage of the transistors M3 and M6 (potential of node N1) and the predetermined reference voltage Vth3. The inverter INV3 inverts the output of the comparator CMP3.

Then, the output Retry_OUT of the inverter INV3 is input in the gate terminal of the switch transistor M9 connected parallel with the transistor M7 of the current mirror circuit CM3 and the NAND G1 of the logic circuit 11. The IC 10 is provided with an external terminal PCT which is connected to a connection node N1 between the transistor M8 of the current mirror circuit CM3 and the drain terminal of the transistors M3 and M6. An external capacitor CT including the timer circuit is connected to the external terminal PCT.

The reference voltage Vth3 is generated by dividing the standard voltage Vref from the standard voltage circuit 13 with a resistance voltage dividing circuit including series resistors R21, R22, and R23. The MOS transistor M16 is connected between a ground point and a connection node N2 between the resistors R22 and R23 of the resistance voltage dividing circuit. The output voltage of the comparator CMP3 is applied to the gate terminal of the transistor M16. The on and off of M16 switches the potential of the connection node N2 to Vth3H or Vth3L. With this, the comparator CMP3 operates as a hysteresis comparator.

The retry circuit 16 according to the present embodiment is provided with a comparator CMP4, an inverter INV4, and an NAND gate G2. The comparator CMP4 compares the potential of the node N1 connected to the external terminal PCT and the predetermined reference voltage Vth4. The inverter INV4 inverts the output of the comparator CMP4. The output of the inverter INV4 and the output of the inverter INV3 are input in the NAND gate G2.

Here, the reference voltage Vth4 is generated by dividing the standard voltage Vref from the standard voltage circuit 13 with a resistance voltage dividing circuit including series resistors R31, R32, and R33. The MOS transistor M17 is connected between the ground point and the connection node N3 between the resistors R32 and R33 of the resistance voltage dividing circuit. The output voltage of the NAND G2 is applied to the gate terminal of the transistor M17. The on and off of M17 switch the potential of the connection node N4 between Vth4H and Vth4L. With this, the comparator CMP4 operates as a hysteresis comparator.

The high-side switch IC according to the present embodiment is provided with an external terminal P1 and MOS transistor M15. The external terminal P1 is used to output the error flag signal Err_Flag to notify to the outside that the overcurrent state (abnormal) is generated. The MOS transistor M15 is connected between the external terminal P1 and the ground point. Then, the output signal Retry_RST of the NAND gate G2 of the retry circuit 16 is input in the gate terminal of the transistor M15. In the normal state, the signal Retry_RST which is the low level is changed to the high level to turn on the transistor M15. With this, the current flows to an external pull-up resistor Rpu connected to the external terminal P1. The error signal Err_Flag of the low level can be output to the CPU, etc. that controls the system from the external terminal P1.

Next, the operation of the retry circuit 16 in the high-side switch IC (or later-described linear regulator IC) including the above configuration is described.

When the level of the control terminal CE becomes high level, the transistor M2 is always turned on and the transistor M3 is always turned off through the inverter INV1. When there is no overcurrent state, the output of the comparator CMP1 is low level and then, the transistor M10 becomes on and the current mirror circuit CM3 becomes off. Since the current mirror CM2 is on, the transistor M6 is turned on and the node N1 becomes low level. With this, the retry circuit 16 becomes a state not operating. Since the node N1 is the low level, the output of the comparator CMP3 becomes the low level, and the Retry_OUT becomes the high level. With this, the transistor M9 is turned off.

When the state is the overcurrent state, the current flowing in the external resistor Rsc increases, the voltage Vsc of the terminal SC which is the input of the comparator CMP 1 exceeds the Vref_OCP. Then, the output of the CMP1 becomes the high level, the M10 is turned off, and the retry circuit 16 is operated. Then, since the transistor M9 is turned off, the transistor M7 of the current mirror circuit CM3 is turned on, and the current Isource flows in M8. Then, the capacitor CT is charged by a difference current between the current Isource and the current Isink (<Isource) of the transistor M6 (Isource-Isink). The potential of the node N1 (=potential VCT of terminal PCT) gradually increases. Then, when the potential of the node N1 (VCT) exceeds the reference voltage Vref_Retry, the output of the comparator CMP3 changes to high level, and the transistor M9 is turned on. With this, the current flowing in the transistors M7 and M8 of the current mirror circuit CM3 is cut.

Then, charge of the capacitor CT is discharged by the current Isink of the transistor M6 and the potential of the node N1, that is, the potential VCT of the terminal PCT gradually decreases. Then, when the potential VCT of the terminal PCT becomes lower than the reference voltage Vref_Retry, the output of the comparator CMP3 changes to the low level and the transistor M9 is turned off. With this, the current flows in the transistors M7 and M8 of the current mirror circuit CM3. By repeating the above operation, as shown in FIG. 2, the potential VCT of the terminal PCT changes to a triangular waveform.

On the other hand, with the condition that the terminal CE is the high level, according to the change of the output of the CMP3, the output of the NAND gate G1 of the logic circuit 11 changes to high/low. Then, the transistor M14 of the control circuit 12 is turned on/off, and the output transistor M1 is turned on/off. That is, when the overcurrent detection circuit 14C detects the overcurrent, the retry circuit 16 performs the overcurrent protection operation intermittently. With this, it is possible to suppress increase of the chip temperature due to the overcurrent continuing to flow. After the overcurrent state is released, the operation automatically resumes steady operation.

Figure 2:
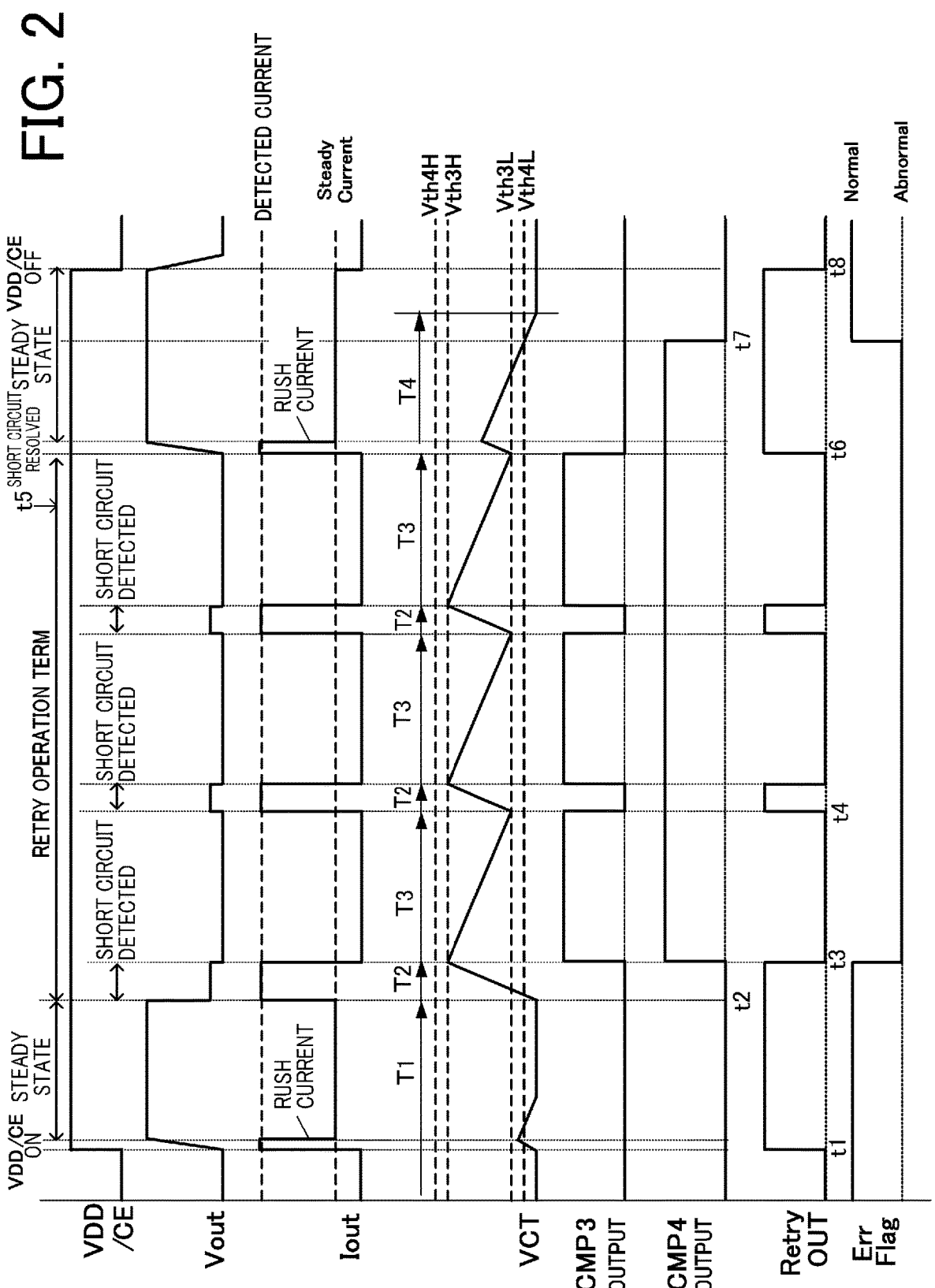
FIG. 2 is a timing chart showing an operation timing of an internal circuit of the high-side switch IC according to the present embodiment.

Next, the operation of the internal circuit of the high-side switch IC10 when the short circuit occurs due to the output terminal OUT or the load and the overcurrent state occurs is described using the timing chart shown in FIG. 2. The comparators CMP3 and CMP4 each include hysteresis characteristics. Therefore, in the description below, regarding the comparator CMP3, the higher threshold value voltage is Vth3H, and the lower threshold value voltage is Vth3L. Regarding the comparator CMP4, the higher threshold value voltage is Vth4H, and the lower threshold value voltage is Vth4L.

According to the present embodiment, the resistance values of the resistors R21, R22, and R23 and the resistors R31, 32, and R33 included in the voltage dividing circuit that divides the standard voltage Vref and generates the threshold value voltage are set so that Vth3H<Vth4H and Vth3L>Vth4L. The reason for setting Vth3H<Vth4H is to prevent the output of the comparator CMP4 changing before the CMP3 when it becomes Vth3H>Vth4H due to variations in manufacturing the elements and the potential VCT of the terminal PCT rises. On the other hand, the reason for setting Vth3L>Vth4L is to continuously maintain the state in which the error flag signal shows an abnormal state during the retry operation as described later. Vth3H and Vth3L may be the same level.

Regarding the operation of the IC10, first, the potential of the control terminal CE rises to the high level at a timing t1 shown in FIG. 2, the output of the inverter INV1 changes to the low level, the transistor M2 turns on and the current flows in the constant current source CC3. At this time, the output of the comparator CMP3 of the retry circuit 16 is the low level, and the output Retry_OUT of the inverter INV3 is the high level. Therefore, the output of the NAND gate G1 is the low level and the transistor M14 is turned off. Therefore, the current flows in the current mirror circuit CM1 of the control circuit 12 and the current flows in the resistor R1. The gate voltage of the output transistor M1 is lowered, M1 is turned on and the output current Iout flows. With this, the state becomes a steady state T1 in which the output voltage Vout is rising.

In the above-mentioned steady state T1, when the short circuit occurs on the output side, the output current Iout and the proportional current Iout' generated by the proportional current generating circuit 14A increase, the overcurrent protection circuit 14 and the current limit circuit 15 detect the overcurrent state, and the output OCP_OUT of the comparator CMP1 and the output CL_OUT of the CMP2 changes to high level (timing t2). Then, the transistor M10 is turned off with the output OCP_OUT of the comparator CMP1 of the retry circuit 16, the transistor M7 of the current mirror circuit CM3 is turned on, and the current Isource flows in the M8. The capacitor CT is charged with the current of the difference between the current Isource and the current Isink of the M6 (<Isource) (Isource-Isink). The potential of the node N1, that is, the potential VCT of the terminal PCT gradually increases (term T2). Note that the time until the VCT increases to the threshold value voltage Vth3H of the comparator CMP3 is a detection delay. When the overcurrent state is released during the detection delay, the state returns to the term T1.

Then, when the potential VCT of the terminal PCT reaches the threshold value voltage Vth3H of the comparator CMP3 (timing t3), the output of the comparator CMP3 changes to the high level, and the output Retry_OUT of the inverter INV3 changes to the low level. The transistor M9 is turned on, and with this, the current flowing in the transistors M7 and M8 of the current mirror circuit CM3 is cut. Then, charge of the capacitor CT is discharged by the current Isink of the transistor M6 and the potential VCT of the terminal PCT gradually decreases (term T3).

Note that at this time, the transistor M16 is turned on, and the threshold value voltage switches from Vth3H to Vth3L. Moreover, when the output of the comparator CMP3 changes to the high level, the output of the NAND gate G2 changes to the high level, and M17 is turned on. With this, the threshold value voltage of the comparator CMP4 switches from Vth4H to Vth4L. With this, the output of the comparator CMP4 changes from the low level to the high level.

Then, when the potential of the potential VCT of the terminal PCT reaches the reference voltage Vth3L (timing t4), the output of the comparator CMP3 changes to the low level, the output Retry_OUT of the inverter INV3 changes to the high level, and the transistor M9 is turned off. With this, the current flows in the transistors M7 and M8 of the current mirror circuit CM3 and the capacitor CT is charged. By repeating the above operation, the potential VCT of the terminal PCT changes to the triangular waveform (retry operation term). In the term (T2) in which the potential VCT of the term PCT increases and the short circuit (overcurrent) is detected, the current temporarily flows in the output transistor M1 and the output voltage Vout becomes slightly higher.

Then, when the short circuit state is released at the timing t5, at the point when the potential VCT of the terminal PCT reaches the reference voltage VTH3L (timing t6), the output Retry_OUT of the inverter INV3 changes to the high level and the transistor M9 is turned off. With this, the current flows in the transistors M7 and M8 of the current mirror circuit CM3, the output transistor M1 is turned on, the output voltage Vout rises, and the state becomes the steady state. The state is maintained until the timing t8 which is when the power supply voltage VDD or the potential of the control terminal CE decreases. At the timing t6, the transistor M16 is turned off, and the threshold value voltage of the comparator CMP3 is switched from Vth3L to Vth3H. Moreover, after the timing T6, the potential VCT of the terminal PCT rises for a while, but immediately starts to fall, and then falls to a ground potential. The output of the comparator CMP4 changes to the low level at the point when the VCT reaches the Vth4L (timing t7). The output of the NAND gate G2 changes to the low level and the transistor M17 is turned off. The threshold value voltage switches from Vth4L to Vth4H.

Next, the change of the state of the error flag signal Err_Flag output from the external terminal P1 is described.

First, in an initial state before the overcurrent is generated, the external capacitor CT of the external terminal PCT is discharged with the current Isink of the transistor M6, and the voltage VCT of the PCT terminal becomes the ground potential. At this time, the output of both comparators CMP3 and CMP4 become the low level and the output of both inverters INV3 and INV4 become the high level. Therefore, the output of the NAND gate G2 becomes the low level, the transistor M15 becomes the off state, and the error flag Err_Flag output by the external terminal P1 maintains the high level (T1 term shown in FIG. 2).

Next, when the overcurrent occurs at the timing t2, the comparator CMP1 detects this and the output becomes the high level. The transistor M10 turns off, and the current Isource flows in M8. The current with the difference between the current Isource and the current Isink of M6 (Isource-Isink) is used to charge the capacitor CT. The potential VCT of the terminal PCT gradually increases (term T2). At this time, the comparators CMP3 and CMP4 have a higher threshold value voltage Vth3H and Vth4H. Therefore, the output of the NAND gate G2 becomes the low level and the error flag Err_Flag is maintained at the high level.

Then, when the overcurrent state continues and the VCT continues to rise, the output of the comparator CMP3 becomes the high level from the relation of Vth3H and Vth4H (Vth3H<Vth4H) (timing t3), and the output signal Retry_OUT of the inverter INV3 becomes the low level. Since the output of the comparator CMP3 becomes the high level first, the threshold value voltage of the comparator CMP3 switches to the lower threshold value voltage Vth3L.

On the other hand, when the signal Retry_OUT becomes the low level, the output of the NAND gate G2 becomes the high level, the transistor M15 turns on, and the error flag Err_Flag changes to the low level. Then, at this time, the transistor M17 is turned on, and the threshold value voltage of the comparator CMP4 is switched to the lower threshold value voltage Vth4L.

When the output of the comparator CMP3 becomes the high level at the timing t3, the transistor M9 is turned off and the discharge of the capacitor CT starts. With this, the potential VCT of the terminal PCT gradually decreases (term T3). Then, when the VCT becomes lower than the lower threshold value voltage Vth3L (timing t4) of the comparator CMP3, the output of the comparator CMP3 changes to the low level, and the output transistor M1 is turned on and restarted.

At this time, when the overcurrent state continues, at the same time as the restart of M1, VCT switches from decrease to increase. At this time, Vth3L and Vth4L are set to be Vth3L>Vth4L. Therefore, the output of the comparator CMP4 is maintained at a high level. With this, the error flag Err_Flag maintains the low level state showing the abnormal state (term T3).

According to the high-side switch IC of the present embodiment, during a retry operation term in which the auto-retry operation of T2 and T3 is repeated due to the overcurrent state continuing, the error flag Err_Flag of the low level showing the abnormal state is continuously output from the external terminal P1. That is, even if the on/off operation of the output transistor M1 is performed by the intermittent protection operation by the retry circuit 16, the signal showing the abnormal state can be continuously output. Therefore, it is possible to avoid the error flag Err_Flag repeating the state showing normal (high) and the state showing abnormal (low) during the intermittent protection operation term. Consequently, the external apparatus that receives the error flag is able to easily determine the abnormal state of the circuit.

Moreover, in a case that the overcurrent state is released during the auto-retry operation in which the output transistor M1 is repeating on and off, as in the term T4, when the potential VCT of the terminal PCT continues to decrease and VCT<Vth4L, the output of the comparator CMP4 changes to the low level, and the output of the NAND gate G2 changes to the high level (timing t7). With this, the transistor M15 is switched to the on state, and the error flag Err_Flag output from the external terminal P1 returns to the high level state showing normal.

For example, when the IC of the present embodiment is used in the system to supply a power supply to a device that handles frequency signals of a tuner, antenna, microphone, or the like, preferably, the frequency of the repeated operation is set to a low frequency so as not to overlap with the frequency band of received and transmitted signals that are handled. Moreover, it is preferable that the term T3 in which the potential VCT of the terminal PCT gradually decreases is longer than the term T2 in which the potential VCT of the terminal PCT gradually increases.

Figure 3:
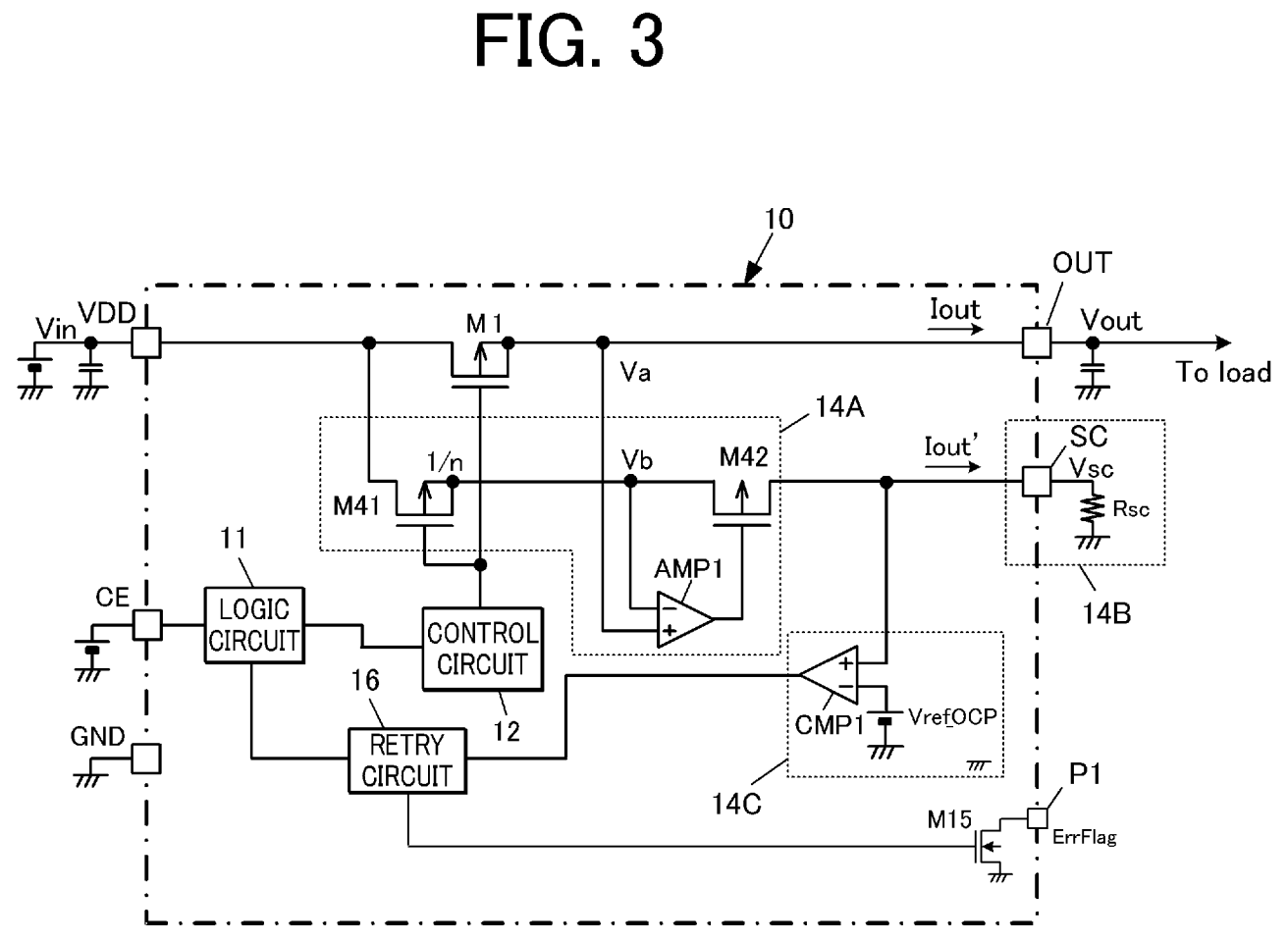

FIG. 3 is a diagram of a configuration of the high-side switch IC 10 describing a specific circuit example of the proportional current generating circuit 14A included in the overcurrent protection circuit 14. In FIG. 3, the illustration of the standard voltage circuit 13 and the current limit circuit 15 are omitted.

As shown in FIG. 3, the proportional current generating circuit 14A includes a P channel MOS transistor M41, a differential amplifier AMP1, and a P channel MOS transistor M42. The P channel MOS transistor M41 has 1/m of the size of the element size of the output transistor M1, the source terminal is linked to the source terminal of M1, and the voltage the same as the gate voltage of M1 is applied to the gate terminal. The drain voltage Va of the transistor M1 and the drain voltage Vb of M41 are input in the differential amplifier AMP1. The P channel MOS transistor M42 is connected between the drain terminal of the transistor M41 and the external terminal SC. The output voltage of the differential amplifier AMP1 is applied to the gate terminal of M42.

The differential amplifier AMP1 operates the transistor M42 so that the drain voltage Vb of the transistor M41 becomes the same as the drain voltage Va of M1. Specifically, the differential amplifier AMP1 controls the gate voltage of the transistor M42 according to the difference of the potential between the drain voltage Va of M1 and the drain voltage Vb of M41. The drain current of M42 increases and decreases according to the potential difference between Va and Vb. With this, since there is feedback which is the change of the drain current of M41, Vb becomes the same as Va.

Then, when Vb is the same as Va, the source voltage, the drain voltage, and the gate voltage of M41 and M1 become the same. As a result, the drain current of M41, that is, the current Iout' that flows from the external terminal SC to the external resistance element Rsc becomes a size proportionally reducing the output current Iout according to a size ratio of M1 and M41. Then, since the current Iout' flows to the resistance element Rsc, the voltage Vsc occurring in the resistor Rsc is input in the overcurrent detection comparator CMP1, and it is possible to detect the overcurrent state of the output current Iout.

Second Example

Figure 4:
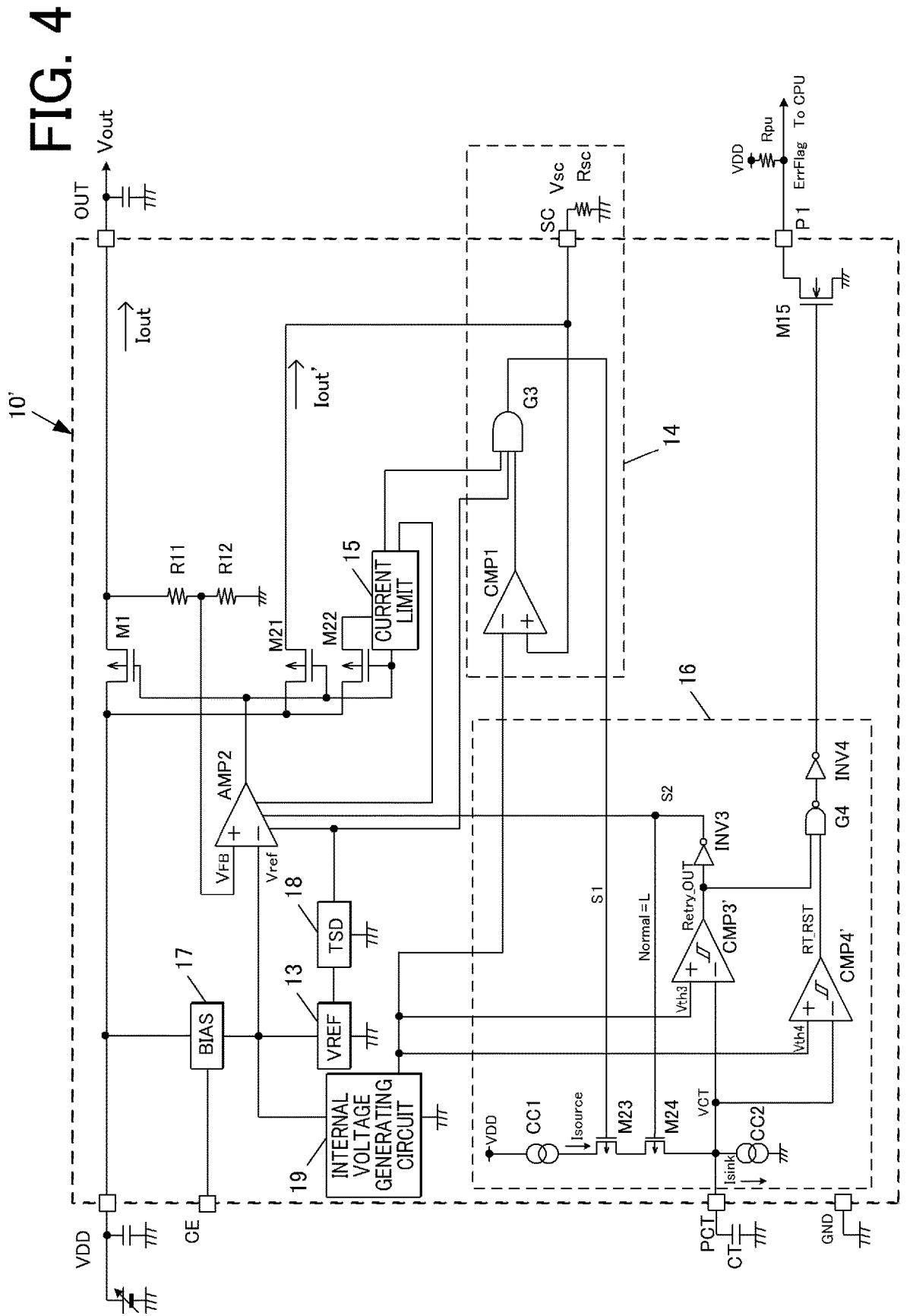
FIG. 4 is a circuit configuration diagram showing an embodiment of a linear regulator IC in which the present invention is applied.
Figure 5:
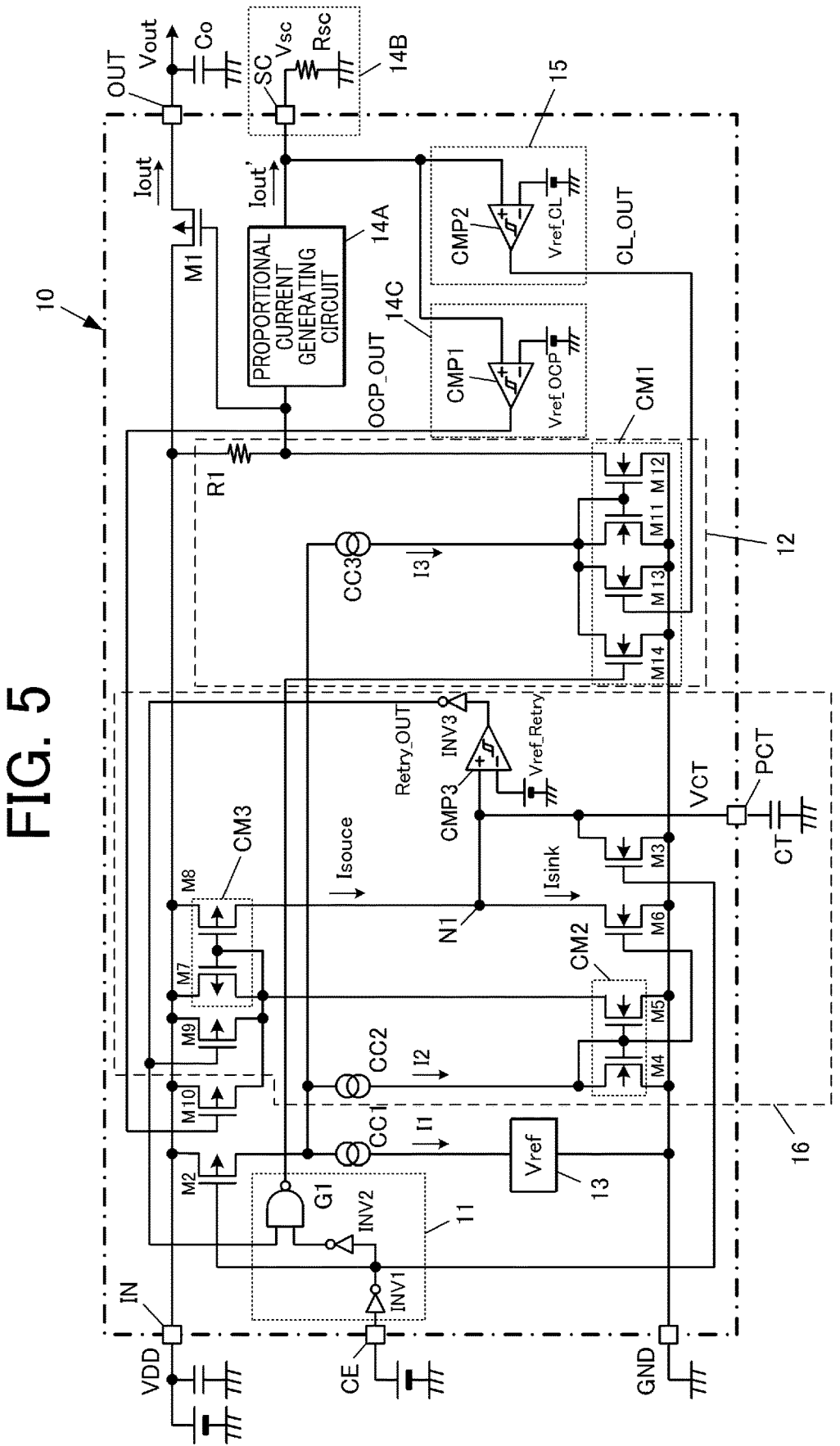
FIG. 5 is a circuit configuration diagram showing a configuration example of an internal circuit of the high-side switch IC.
Figure 6:
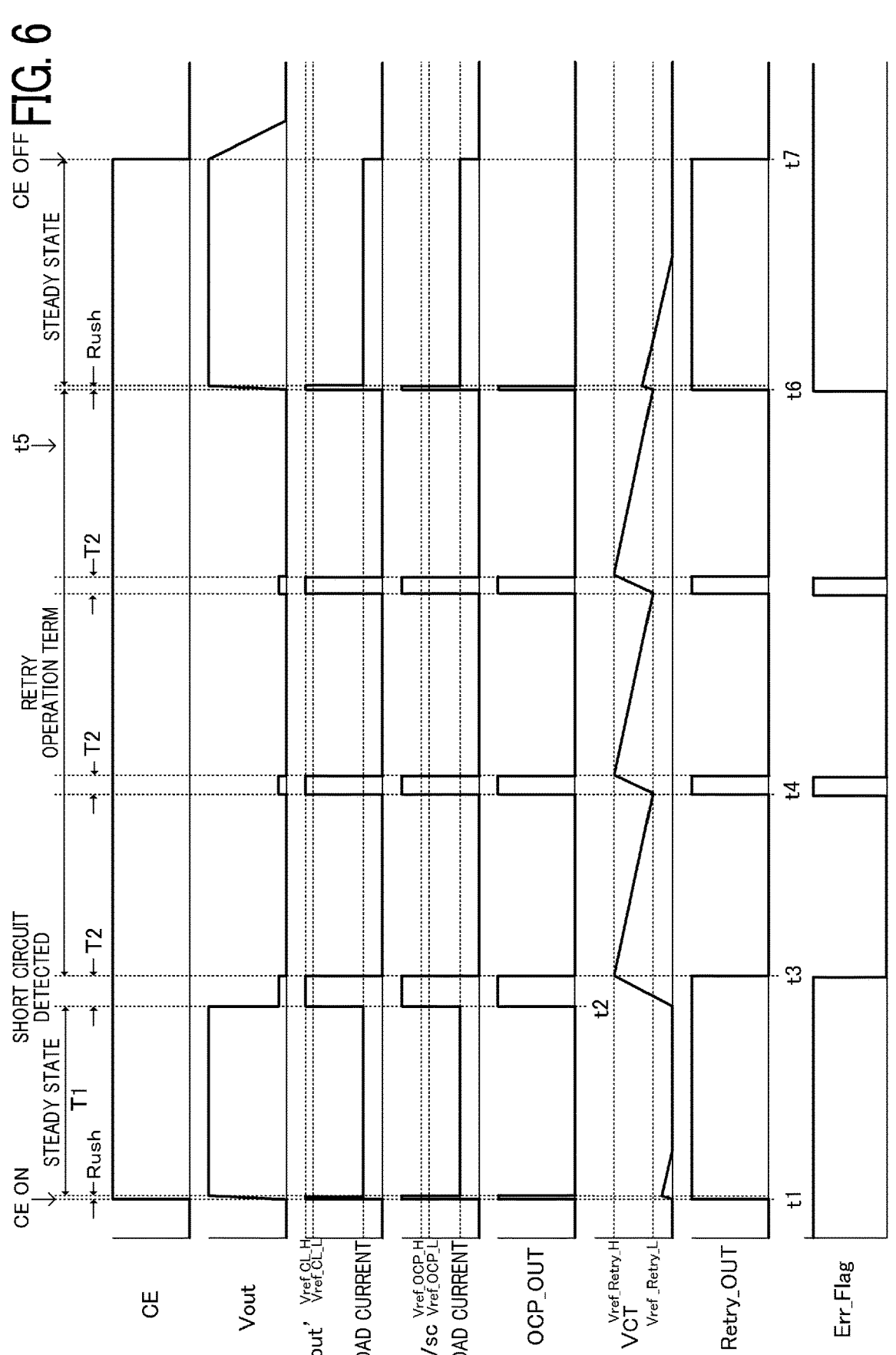
FIG. 6 is a timing chart showing an operation timing of an internal circuit of the high-side switch IC shown in FIG. 5.

FIG. 4 shows an embodiment of a linear regulator IC as a power supply IC in which the present invention is applied. In FIG. 4, the elements and circuits including the same functions as the elements and circuits included in the IC shown in FIG. 1 are given the same reference numerals and the redundant explanations will be omitted.

In the linear regulator IC 10' according to the present embodiment, as shown in FIG. 4, the voltage control output transistor M1 including the P channel MOS transistor is connected between the voltage input terminal IN in which the DC voltage VDD is applied and the output terminal OUT. Bleeder resistors R11 and R12 which divide the output voltage Vout are connected in series between the output terminal OUT and the ground terminal GND in which ground potential is applied.

The voltage VFB divided by the output voltage resistors R11 and R12 are fed back to a non-inverting input terminal of an error amplifier AMP2 as the control circuit 12 that controls the gate terminal of the output transistor M1. Then, the error amplifier AMP2 controls the output transistor M1 according to a potential difference between the output feedback voltage VFB and the predetermined reference voltage Vref and controls the output voltage Vout to be a desired potential.

According to the linear regulator IC10' of the present embodiment, a bias circuit 17, a thermal shutdown circuit 18 and an internal voltage generating circuit 19 are provided. The bias circuit 17 flows operation currents in a standard voltage circuit 13 that generates a standard voltage Vref applied to the inverting input terminal of the error amplifier AMP2. The thermal shutdown circuit 18 stops the operation of the error amplifier AMP2 when the temperature of the chip rises to a predetermined temperature or more and turns off the transistor M1. The internal voltage generating circuit 19 generates the reference voltage of the various types of comparators in the IC including the overcurrent detection comparator CMP1. The bias circuit 17 may include a current mirror circuit or the like. The internal voltage generating circuit 19 generates a reference voltage based on the standard voltage Vref. Alternatively, the reference voltage may be generated based on the input voltage VDD.

The linear regulator IC10' according to the present embodiment is provided with MOS transistors M21 and M22 and AND gate G3. The MOS transistors M21 and M22 are connected to the output transistor M1 by a current mirror connection. The signal from the current limit circuit 15, the signal from the thermal shutdown circuit 18, and the output signal of the overcurrent detection comparator CMP1 are input to the AND gate G3.

The output voltage of the error amplifier AMP2 which is the same as the voltage applied to the gate terminal of the output transistor M1 is applied to the gate terminal of the transistors M21 and M22. The size of the transistors M21 and M22 is 1/n of the size (gate width) of the output transistor M1. With this, a drain current with 1/n of the size of the drain current of M1 flows in M21 and M22.

The source terminal of the transistor M21 is connected to the external terminal SC for connecting the resistor Rsc used for current-voltage conversion outside the chip. Since the current flowing in the resistor Rsc is a current proportional to the output current Iout, the voltage of the external terminal SC becomes a voltage proportional to the output current Iout. The voltage is input in the overcurrent detection comparator CMP1.

The source terminal of the transistor M22 is connected to the current limit circuit 15, and the gate voltage is controlled by the current limit circuit 15. With this, the current is limited.

The retry circuit 16 according to the present embodiment includes a constant current source CC1 and a constant current source CC2. The constant current source CC1 flows a charge current Isource of the capacitor CT connected to the external terminal PCT. The constant current source CC2 flows a discharge current Isink of the capacitor CT. The constant current source CC1 and the constant current source CC2 are connected in series between the terminal to which the power supply voltage VDD is applied and the ground point. Switch transistors M23 and M24 are connected in series between the constant current sources CC1 and CC2. The connection node between the transistor M24 and the constant current source CC2 is connected to the external terminal PCT.

The output signal of the AND gate G3 is input in the gate terminal of the transistor M23. The signal output from the comparator CMP3' and inverted by the INV3 is input in the gate terminal of the transistor M24. The voltage VCT of the external terminal PCT is input in the inverted input terminal of the comparators CMP3' and CMP4'. This is compared with the reference voltages Vth3 and Vth4 from the internal voltage generating circuit 19. Then, the output of the comparator CMP3' is inverted in the inverter INV3 and the inverted signal is supplied to the error amplifier AMP2. When the overcurrent is detected, the output of the error amplifier AMP2 is fixed to low level and the output transistor M1 is turned off.

Further, in the retry circuit 16 according to the present embodiment, the output signal of the comparator CMP3' and the output signal of the comparator CMP4' are input in the NAND gate G4. The output of the NAND gate G4 is inverted in the inverter INV4 and the inverted signal is input in the gate terminal of the transistor M15 connected to the error flag output external terminal P1.

The comparators CMP3' and CMP4' shown in FIG. 4 are hysteresis comparators. The above corresponds to the circuit combining the comparators CMP3 and CMP4, the resistors R21, R22, R23, R31, R32, and R33 of the resistance voltage dividing circuits, and the transistors M16 and M17 as shown in the circuit shown in FIG. 1. That is, the higher threshold value voltages Vth3H and Vth4H and the lower threshold value voltages Vth3L and Vth4L are respectively generated based on the reference voltages Vth3 and Vth4 from the internal voltage generating circuit 19 in the comparators CMP3' and CMP4'. The threshold values are set so that the following relationships are satisfied, Vth3H<Vth4H, Vth3L>Vth4L.

In the linear regulator IC10' according to the present embodiment including the above configuration, similar to the high-side switch IC according to the first example shown in FIG. 1, when the retry circuit 16 operates and the overcurrent state is generated, the overcurrent protection operation in which the operation to detect the overcurrent and the operation to turn off the output transistor M1 intermittently is performed. With this, the IC chip is protected. Moreover, once the overcurrent state is resolved, this is detected and the automatic recovery of the steady state is possible.

In the linear regulator IC10' according to the present embodiment, the threshold value voltages Vth3H, Vth3L, Vth4H, and Vth4L of the comparators CMP3' and CMP4' are set to have the following relationships, Vth3H<Vth4H, Vth3L>Vth4L. similar to the timing chart shown in FIG. 2, the overcurrent state continues. With this, during the retry operation term in which the auto-retry operation is repeated, the error flag Err_Flag of the low level showing the abnormal state can be continuously output by the external terminal P1.

Further, according to the present embodiment, the thermal shutdown circuit 18 is provided. Together with the output signal of the overcurrent detection comparator CMP1, the output signal of the thermal shutdown circuit 18 is input in the AND gate G3. The output signal of the AND gate G3 controls the on and off of the transistor M23 connected in series with the constant current source CC1. Therefore, even if the chip temperature rises and the thermal shutdown circuit 18 operates, the retry operation in which the output transistor M1 is turned off and restarted is performed. During the retry operation term in which such auto-retry operation is repeated, the error flag Err_Flag of the low level showing the abnormal state can be continuously output by the external terminal P1.

The present invention conceived by the inventors is described in detail on the basis of the embodiments, but the present invention is not limited to the embodiments described above. For example, according to the embodiment of the high-side switch IC10 shown in FIG. 1, the thermal shutdown circuit 18 is not provided. However, similar to the linear regulator IC10' shown in FIG. 4, the thermal shutdown circuit 18 can be provided. Conversely, a configuration in which the thermal shutdown circuit 18 is omitted can be applied in the linear regulator IC shown in FIG. 4.

Further, according to the present embodiment, the MOS transistor is used as the transistor in the configuration of the internal circuit of the high-side switch IC10 and the linear regulator IC10'. Alternatively, the bipolar transistor may be used instead of the MOS transistor. The capacitor CT may be formed on an IC chip instead of the external element. The output MOS transistor M1 may be a P-channel type or a N-channel type.

According to the present embodiment, the present invention is applied to the high-side switch IC10 and the linear regulator IC10'. However, the present invention is not limited to the above IC. For example, the present invention can be widely used in a semiconductor integrated circuit device including a transistor connected between a voltage input terminal and a voltage output terminal such as a charging IC of a secondary battery.

According to the present invention, a semiconductor integrated circuit device includes an output transistor connected between a voltage input terminal and an output terminal, and an overcurrent protection circuit. The semiconductor integrated circuit device includes a retry function which repeats an operation to automatically resume to a steady state once the overcurrent state is resolved. The semiconductor integrated circuit device continues to output a signal showing an abnormal state while the retry operation is repeated. With this, the external apparatus receives the signal showing the abnormal state, the abnormal state of the circuit can be determined easily and accurately, and the usability improves.

The present invention can be applied to the semiconductor integrated circuit devices to be used for different purposes such as the high-side switch IC and the power supply IC.

According to the present invention, a semiconductor integrated circuit device includes an output transistor connected between a voltage input terminal and an output terminal, and an overcurrent protection circuit. The semiconductor integrated circuit device includes a retry function which repeats an operation to cut the output current before exceeding an allowable loss without using the overheat protection function and to automatically resume to a steady state once the overcurrent state is resolved. The semiconductor integrated circuit device continues to output a signal showing an abnormal state while the retry operation is repeated.

The invention claimed is:

1. A semiconductor integrated circuit device, comprising:
an output transistor that is connected between a voltage input terminal to which a DC voltage is input and a voltage output terminal;
a control circuit that controls an on state or an off state of the output transistor;
an overcurrent detection circuit that is configured to detect a current that is a predetermined value or more flowing in the output transistor;
a retry circuit that generates and outputs a signal to intermittently switch the output transistor to the off state according to the overcurrent detection circuit detecting an overcurrent state of an output current; and
an external terminal that is configured to output an error flag signal showing an abnormality of an internal circuit,
wherein the control circuit is configured to repeat control to temporarily turn off the output transistor based on a signal output from the retry circuit,
wherein after the overcurrent detection circuit detects the overcurrent state of the output current, the retry circuit is configured so that the error flag signal continuously shows an abnormality while the control circuit repeats control to temporarily turn off the output transistor,
wherein the retry circuit includes:
a timer circuit that includes a first constant current source that charges a capacitor and a second constant current source that discharges the capacitor, wherein the timer circuit counts a predetermined amount of time,
a first voltage comparison circuit that compares a voltage of a charge/discharge node of the timer circuit with a predetermined first low threshold value voltage or a predetermined first high threshold value voltage, and
a second voltage comparison circuit that compares a voltage of a charge/discharge node of the timer circuit with a predetermined second low threshold value voltage or a predetermined second high threshold value voltage,
wherein the first voltage comparison circuit and the second voltage comparison circuit use a higher threshold value voltage in a comparison when the voltage that is a target to be compared is rising, and use a lower threshold value voltage in a comparison when the voltage that is the target to be compared is decreasing,
wherein the retry circuit changes the error flag signal to a state showing an abnormality when it is detected that the voltage of the charge/discharge node is higher than the first high threshold value voltage or the second high threshold value voltage based on a signal output from the first voltage comparison circuit or the second voltage comparison circuit, and
wherein the retry circuit returns the error flag signal to a state showing normal when the first voltage comparison circuit detects that the voltage of the charge/discharge node is equal to or lower than the first low threshold value voltage and the second voltage comparison circuit detects that the voltage of the charge/discharge node is equal to or lower than the second low threshold value voltage.

2. The semiconductor integrated circuit device according to claim 1, wherein:
the timer circuit is configured to start a charging operation according to the overcurrent detection circuit detecting an overcurrent state and to start a discharging operation according to the first voltage comparison circuit detecting that the voltage of the charge/discharge node reached the first high threshold value voltage, and the control circuit is configured to temporarily turn off the output transistor when it is detected that the voltage of the charge/discharge node is higher than the first high threshold value voltage based on the signal output from the first voltage comparison circuit.

3. The semiconductor integrated circuit device according to claim 1, wherein:

the first high threshold value voltage is set to a value lower than the second high threshold value voltage, and the retry circuit is configured to change the error flag signal to a state showing an abnormality when it is detected that the voltage of the charge/discharge node of the timer circuit is higher than the first high threshold value voltage based on a signal output from the first voltage comparison circuit.

4. The semiconductor integrated circuit device according to claim 1, further comprising a switch transistor connected between the external terminal and a ground point, wherein the retry circuit outputs a signal to set the switch transistor to an on state or an off state, and wherein according to the on state or the off state of the switch transistor, the error flag signal is output from the external terminal.

5. The semiconductor integrated circuit device according to claim 4, wherein; the semiconductor integrated circuit device is a high-side switch semiconductor integrated circuit device including:

a first transistor that is connected parallel with the output transistor and in which a signal the same as a control signal applied to a control terminal of the output transistor is applied to a control terminal of the first transistor, a second transistor and a current-voltage convertor that are connected in series with the first transistor between the voltage input terminal and a ground point, and a differential amplifier circuit in which a voltage of an output side of the output transistor and a voltage of a connection node of the first transistor and the second transistor are input, wherein the output of the differential amplifier circuit is applied to a control terminal of the second transistor, and wherein the overcurrent detection circuit is configured to detect the current that is the predetermined value or more flowing in the output transistor by a voltage in which current-voltage conversion is performed by the current-voltage converter being supplied to a comparator included in the overcurrent detection circuit, and the voltage being compared with a predetermined reference voltage.

6. The semiconductor integrated circuit device according to claim 4, wherein, the semiconductor integrated circuit device is a linear regulator semiconductor integrated circuit device including:

a first transistor that is connected parallel with the output transistor and in which a signal the same as a control signal applied to a control terminal of the output transistor is applied to a control terminal of the first transistor, and a current-voltage convertor that is connected in series with the first transistor between the voltage input terminal and a ground point, and wherein a voltage in which current-voltage conversion is performed by the current-voltage converter is supplied to the overcurrent detection circuit.

* * * * *